United States Patent
Tsai et al.

(10) Patent No.: US 8,664,736 B2
(45) Date of Patent: Mar. 4, 2014

(54) BONDING PAD STRUCTURE FOR A BACKSIDE ILLUMINATED IMAGE SENSOR DEVICE AND METHOD OF MANUFACTURING THE SAME

(75) Inventors: Shuang-Ji Tsai, Tainan County (TW); Dun-Nian Yaung, Taipei (TW); Jen-Cheng Liu, Hsin-Chu (TW); Jeng-Shyan Lin, Tainan (TW); Wen-De Wang, Chiayi County (TW); Yueh-Chiou Lin, Taichung County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1 day.

(21) Appl. No.: 13/112,755

(22) Filed: May 20, 2011

(65) Prior Publication Data

US 2012/0292730 A1    Nov. 22, 2012

(51) Int. Cl.
*H01L 27/146* (2006.01)

(52) U.S. Cl.
USPC ........... 257/443; 257/447; 257/460; 257/428; 257/E27.13; 257/E31.124; 438/98

(58) Field of Classification Search
USPC ................... 257/447, 460, 443, 428, E27.13, 257/E31.124; 438/98
See application file for complete search history.

(56) References Cited

U.S. PATENT DOCUMENTS

| | | | |
|---|---|---|---|
| 6,004,857 A * | 12/1999 | Hsiao et al. | 438/396 |
| 7,129,532 B2 | 10/2006 | Lee | |
| 7,507,598 B2 | 3/2009 | Weng et al. | |
| 7,659,595 B2 | 2/2010 | Shiau et al. | |
| 2007/0215971 A1 * | 9/2007 | Yamamoto et al. | 257/432 |
| 2009/0104730 A1 | 4/2009 | Kao | |
| 2009/0124073 A1 * | 5/2009 | Liu et al. | 438/612 |
| 2009/0185060 A1 * | 7/2009 | Akiyama | 348/294 |
| 2009/0280596 A1 | 11/2009 | Akiyama | |
| 2009/0321888 A1 * | 12/2009 | Liu et al. | 257/618 |
| 2011/0024866 A1 | 2/2011 | Tseng et al. | |
| 2012/0292730 A1 | 11/2012 | Tsai et al. | |

OTHER PUBLICATIONS

United States Patent and Trademark Office, Final Office Action, U.S. Appl. No. 13/112,828, mailed Aug. 14, 2012, 12 pages, Alexandria, VA.
United States Patent and Trademark Office, Final Office Action, U.S. Appl. No. 13/112,828, mailed Nov. 20, 2012, 13 pages, Alexandria, VA.

* cited by examiner

*Primary Examiner* — Kimberly Rizkallah
*Assistant Examiner* — Alexander Belousov
(74) *Attorney, Agent, or Firm* — Haynes and Boone, LLP

(57) ABSTRACT

A semiconductor device including a device substrate having a front side and a back side. The semiconductor device further includes an interconnect structure disposed on the front side of the device substrate, the interconnect structure having a n-number of metal layers. The semiconductor device also includes a bonding pad disposed on the back side of the device substrate, the bonding pad extending through the interconnect structure and directly contacting the nth metal layer of the n-number of metal layers.

15 Claims, 7 Drawing Sheets

BONDING PAD STRUCTURE FOR A BACKSIDE ILLUMINATED IMAGE SENSOR DEVICE AND METHOD OF MANUFACTURING THE SAME

CROSS-REFERENCE TO RELATED APPLICATIONS

The present application is related to U.S. patent application Ser. No. 13/112,828, entitled, "Semiconductor Device Having a Bonding Pad and Shield Structure and Method of Manufacturing the Same," filed concurrently herewith, which is hereby incorporated by reference in its entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

Pads used for various applications, such as probe and/or wire bonding (generally referred to hereafter as a bonding pad) often have separate requirements than other features of an IC. For example, a bonding pad must have sufficient size and strength to withstand physical contact due to such actions as probing or wire bonding. There is often a simultaneous desire to make features relatively small (both in size and in thickness). For example, in applications such as a complementary metal-oxide semiconductor (CMOS) image sensor, it is often desired to have one or more relatively thin metal layers, for example a metal layer of aluminum copper (AlCu). A problem with thin metal layers is that the bond pads formed in these layers can exhibit peeling or other defects. A need therefore exists to accommodate the various requirements of these features.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
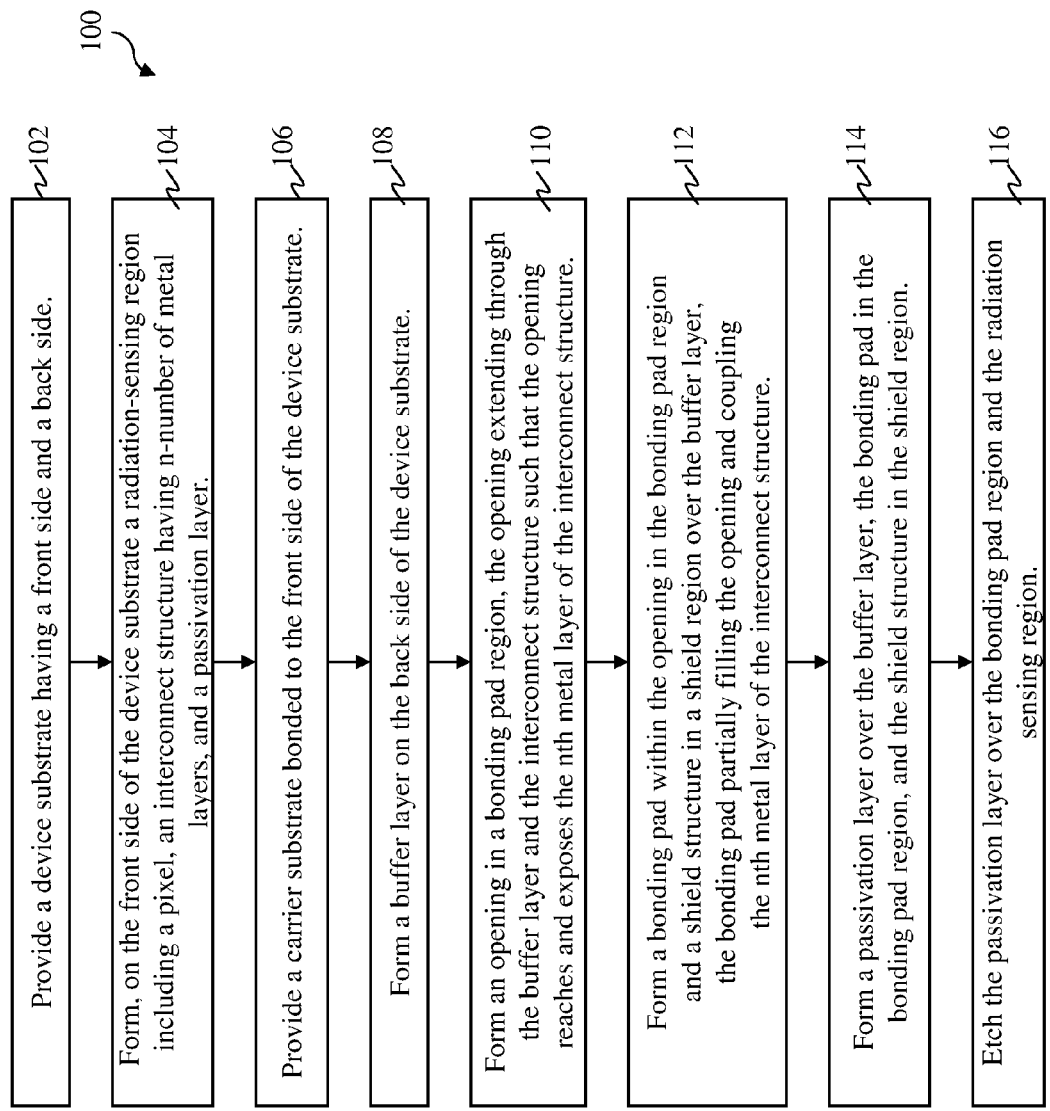
FIG. 1 is a flowchart illustrating a method of forming a semiconductor device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. It is understood that those skilled in the art will be able to devise various equivalents that, although not explicitly described herein, embody the principles of the present invention.

Examples of devices that can benefit from one or more embodiments of the present invention are semiconductor devices with image sensors. Such a device, for example, is a back-side illuminated (BSI) image sensor device. The following disclosure will continue with this example to illustrate various embodiments of the present invention. It is understood, however, that the invention should not be limited to a particular type of device, except as specifically claimed.

Referring to FIG. 1, a method 100 for fabricating a semiconductor device is described according to various aspects of the present disclosure. The method 100 begins with step 102 in which a device substrate having a front side and a back side is provided. The method 100 continues with step 104 in which sensors are formed in the device substrate. Also, at step 104 an interconnect structure having n-number of metal layers, and a passivation layer are formed on the device substrate. The nth metal layer is the top-most metal layer. The method 100 continues with step 106 in which a carrier substrate is provided and bonded to the front side of the device substrate. The method 100 continues at step 108 in which a buffer layer, which may be transparent, is formed on the back side of the device substrate. The method 100 continues at step 110 in which a opening is formed in a bonding region, the opening extending through the interconnect structure such that the opening reaches and exposes the nth metal layer of the interconnect structure. The method 100 continues at step 112 in which a bonding pad is formed within the opening in the bonding region and a shield structure is formed in a shield region over the buffer layer, the bonding pad partially filling the opening and coupling the nth metal layer of the interconnect structure. The method 100 continues at step 114 in which a passivation layer is formed over the buffer layer, the bonding pad in the bonding region, and the shield structure in the shield region. The method 100 continues at step 116 in which an etch process removes the passivation layer disposed over the bonding region and the radiation-sensing region. Additional steps can be provided before, during, and after the method 100, and some of the steps described can be replaced or eliminated for other embodiments of the method. The discussion that follows illustrates various embodiments of a semiconductor device that can be fabricated according to the method 100 of FIG. 1.

FIGS. 2 to 7 are diagrammatic sectional side views of one embodiment of a semiconductor device that is a back-side illuminated (BSI) image sensor device 200 at various stages of fabrication according to the method 100 of FIG. 1. The image sensor device 200 includes pixels (sensors) for sensing and recording an intensity of radiation (such as light) directed toward a back-side of the image sensor device 200. The image sensor device 200 may include a charge-coupled device (CCD), complimentary metal oxide semiconductor (CMOS) image sensor (CIS), an active-pixel sensor (APS), or a passive-pixel sensor. The image sensor device 200 further includes additional circuitry and input/outputs that are provided adjacent to the sensors for providing an operation environment for the sensors and for supporting external communication with the sensors. It is understood that FIGS. 2 to 7 have been simplified for a better understanding of the inventive concepts of the present disclosure and may not be drawn to scale.

Figure 2:
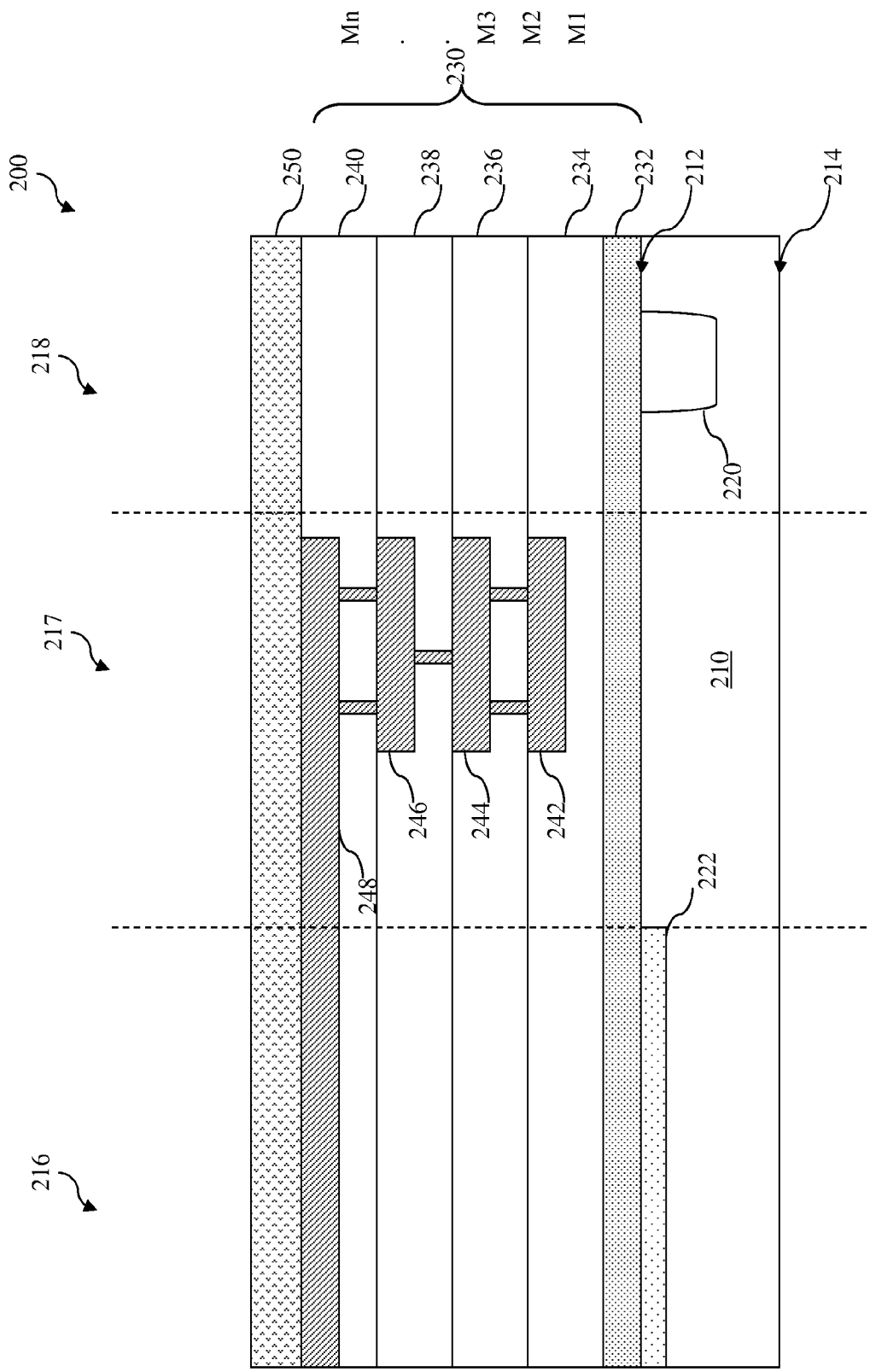
FIGS. 2 to 7 illustrate diagrammatic cross-sectional side views of one embodiment of a semiconductor device at various stages of fabrication according to the method of FIG. 1.

With reference to FIG. 2, the BSI image sensor device 200 includes a device substrate 210. The device substrate 210 has a front side 212 and a back side 214. In the present embodiment, the device substrate 210 is a silicon substrate doped with a p-type dopant such as boron (for example a p-type substrate). Alternatively, the device substrate 210 could be another suitable semiconductor material. For example, the device substrate 210 may be a silicon substrate that is doped with an n-type dopant such as phosphorous or arsenic (an n-type substrate). The device substrate 210 could include other elementary materials such as germanium and diamond. The device substrate 210 could optionally include a compound semiconductor and/or an alloy semiconductor. Further, the device substrate 210 could include an epitaxial layer (epi layer), may be strained for performance enhancement, and may include a silicon-on-insulator (SOI) structure.

The device substrate 210 includes a bonding region 216, a shield region 217, and a radiation-sensing region 218. The broken lines in FIG. 2 designate an approximate boundary between the regions. The radiation-sensing region 218 is a region of the device substrate 210 where radiation-sensing devices will be formed. The radiation-sensing region 218, for example, includes sensor 220. The sensor 220 is operable to sense radiation, such as an incident light (thereafter referred to as light), that is projected toward the back side 214 of the device substrate 210. The sensor 220 includes a photodiode in the present embodiment. In other embodiments, the sensor 220 may include pinned layer photodiodes, photogates, reset transistors, source follower transistors, and transfer transistors. Further, the sensor 220 may be varied from one another to have different junction depths, thicknesses, and so forth. For the sake of simplicity, only sensor 220 is illustrated in FIG. 2, but it is understood that any number of sensors may be implemented in the device substrate 210. Where more than one sensor is implemented, the radiation-sensing region includes isolation structures that provide electrical and optical isolation between the adjacent sensors.

The shield region 217 is a region where one or more shield structure of the BSI image sensor device 200 will be formed in a later processing state. The bonding region 216 is a region where one or more bonding pads of the BSI image sensor device 200 will be formed in a later processing stage, so that electrical connections between the BSI image sensor device 200 and external devices may be established. It is also understood that regions 216, 217, and 218 extend vertically above and below the device substrate 210.

Referring back to FIG. 2, a shallow trench isolation (STI) layer 222 is formed over the front side 212 of the BSI image sensor device 200. The STI layer 222 may include suitable dielectric material. For example, the STI layer 222 may include silicon oxide, The STI layer 222 may be formed by a process such as chemical vapor deposition (CVD), high density plasma chemical vapor deposition (HDPCVD), a plasma enhanced chemical vapor deposition (PECVD), atomic layer deposition (ALD), physical vapor deposition (PVD), combinations thereof, or other suitable processes. An interconnect structure 230 is formed over the front side of the device substrate 210. The interconnect structure 230 includes a plurality of patterned dielectric layers and a plurality of conductive layers that provide interconnections between the various doped features, circuitry, and input/output of the image sensor device 200. The plurality of conductive layers number from 1 to n, with the nth conductive layer being the top-most layer. In the present embodiment, the interconnect structure 230 includes an interlayer dielectric (ILD) layer 232 and a plurality of intermetal dielectric (IMD) layers 234, 236, 238, and 240. The ILD layer 232 and the plurality of intermetal dielectric (IMD) layers 234, 236, 238, and 240 layers may include suitable dielectric material. For example, in the present embodiment, the ILD layer 232 and the plurality of intermetal dielectric (IMD) layers 234, 236, 238, and 240 includes a low dielectric constant (low-k) material, the material having a constant lower than that of thermal silicon oxide. In other embodiments, the ILD layer 232 and the plurality of intermetal dielectric (IMD) layers 234, 236, 238, and 240 includes a dielectric material. The dielectric material may be formed by CVD, HDPCVD, PECVD, ALD, PVD, combinations thereof, or other suitable processes.

Each of the IMD layers 234, 236, 238, and 240 includes contacts, vias and a metal layer 242, 244, 246, and 248, respectively. For the purposes of illustration, only four IMD layers are shown in FIG. 2, it being understood that any number (n-number) of IMD layers may be implemented and that the IMD layers as illustrated are merely exemplary, and the actual positioning and configuration of the metal layers and vias/contacts may vary depending on design needs.

The interconnect structure 230 may include conductive materials such as aluminum, aluminum/silicon/copper alloy, titanium, titanium nitride, tungsten, polysilicon, metal silicide, or combinations thereof, being referred to as aluminum interconnects. Aluminum interconnects may be formed by a process including CVD, HDPCVD, PECVD, ALD, PVD, combinations thereof, or other suitable processes. Other manufacturing techniques to form the aluminum interconnect may include photolithography processing and etching to pattern the conductive materials for vertical connection (for example, vias/contacts) and horizontal connection (for example, metal layers). Alternatively, a copper multilayer interconnect may be used to form the metal patterns. The copper interconnect structure may include copper, copper alloy, titanium, titanium nitride, tantalum, tantalum nitride, tungsten, polysilicon, metal silicide, or combinations thereof. The copper interconnect may be formed by a technique including CVD, sputtering, plating, or other suitable processes.

Still referring to FIG. 2, in the present embodiment, a passivation layer 250 is formed over the interconnect structure 230 and in direct contact with the nth metal layer 248. The passivation layer 250 may include any suitable dielectric material. In the present embodiment, the passivation layer 250 includes silicon oxide or silicon nitride. The passivation layer 250 may be formed by CVD, HDPCVD, PECVD, ALD, PVD, combinations thereof, or other suitable processes. The passivation layer 250 is planarized to form a smooth surface by a chemical mechanical polishing (CMP) process.

Figure 3:
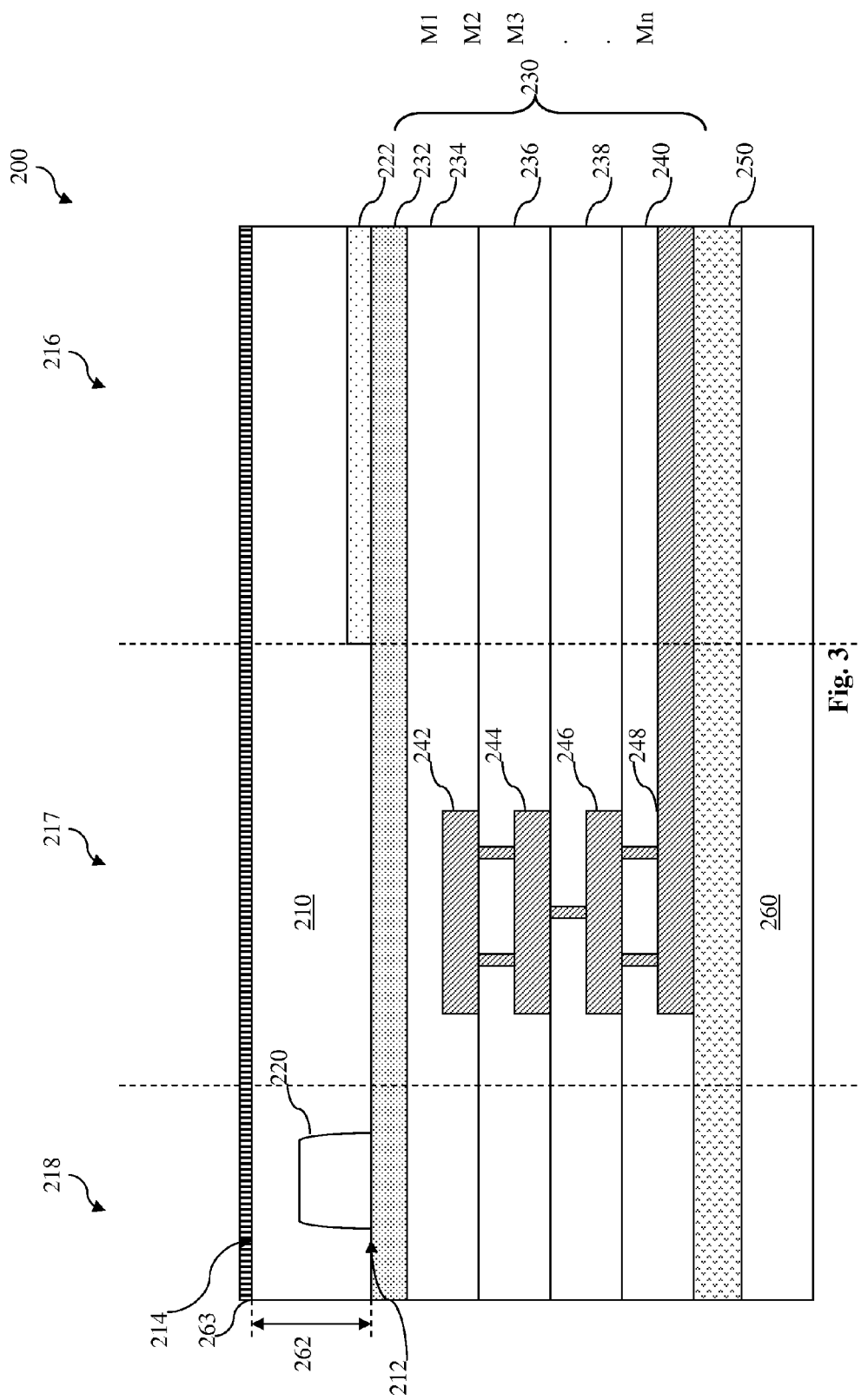

With reference to FIG. 3, a carrier substrate 260 is bonded with the device substrate 210 through the passivation layer 250, so that processing the back side 214 of the device substrate 210 can be performed. The carrier substrate 260 in the present embodiment is similar to the device substrate 210 and includes a silicon material. Alternatively, the carrier substrate 260 may include a glass substrate or another suitable material. The carrier substrate 260 may be bonded to the device substrate 210 by molecular forces—a technique known as direct bonding or optical fusion bonding—or by other bonding techniques known in the art, such as metal diffusion or anodic bonding. The passivation layer 250 provides electrical isolation between the device substrate 210 and the carrier substrate 260. The carrier substrate 260 provides protection for the various features formed on the front side 212 of the device substrate 210, such as the sensor 220. The carrier substrate 260 also provides mechanical strength and support for processing the back side 214 of the device substrate 210.

After bonding, the device substrate 210 and the carrier substrate 260 may optionally be annealed to enhance bonding strength. A thinning process is performed to thin the device substrate 210 from the back side 214. The thinning process may include a mechanical grinding process and a chemical thinning process. A substantial amount of substrate material may be first removed from the device substrate 210 during the mechanical grinding process. Afterwards, the chemical thinning process may apply an etching chemical to the back side 214 of the device substrate 210 to further thin the device substrate 210 to a thickness 262. The device substrate 210 thickness 262 is in the range of about 1 microns to about 6 microns. In the present embodiment, the thickness 262 is about 2 microns. It is also understood that the particular thicknesses disclosed in the present disclosure serves as a mere example and that other thicknesses may be implemented depending on the type of application and design requirements of the image sensor device 200.

Still referring to FIG. 3, a antireflective coating (ARC) layer 263 is formed over the back side 214 of the device substrate 210.

Figure 4:
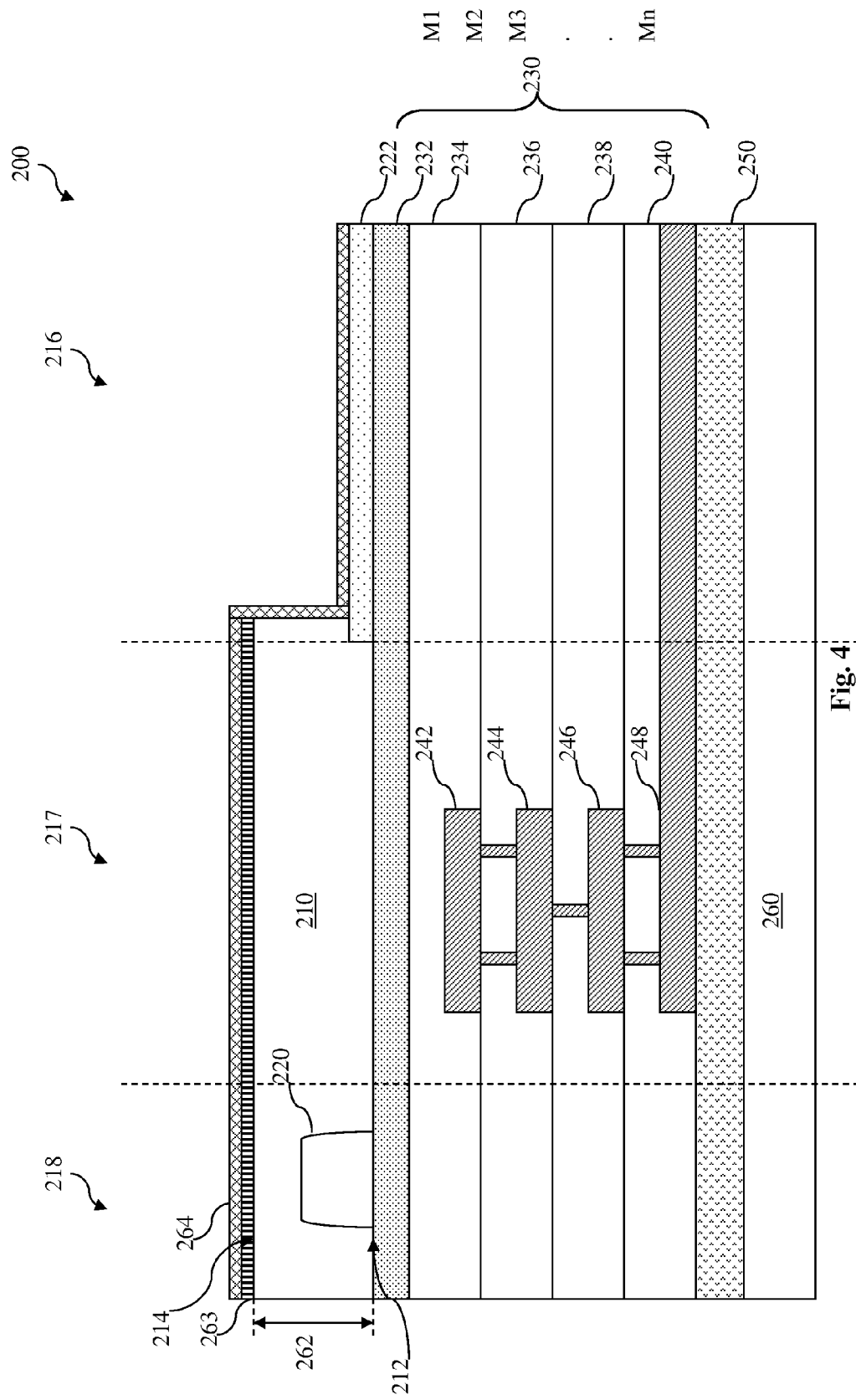

FIG. 4 illustrates removing material of the buffer layer 264 and portions of the device substrate 210 in the bonding region 216, according to an embodiment of the present disclosure. A photolithography process may be performed on the ARC layer 263 and the device substrate 210 therebelow in the bonding region 216. The photolithography process uses the STI layer 222 as a stop etch layer. The photolithography process includes forming a photoresist layer on the ARC layer 263 and performing various masking, exposing, baking, and rinsing processes to form a patterned photoresist mask. The patterned photoresist mask protects portions of the ARC layer and the device substrate 210 therebelow in another etching process to remove material from the ARC layer and the device substrate 210. It is understood that the photoresist mask is stripped away after the removal of the material.

Still referring to FIG. 4, a buffer layer 264 is formed over the back side 214 of the device substrate 210 and the STI layer 222. The buffer layer 264 may be transparent. The buffer layer 264 may include any suitable dielectric material. In the present embodiment, the buffer layer 264 includes silicon oxide or silicon nitride. In the present embodiment, the buffer layer 264, is formed by a process such as CVD, PVD, HDPCVD, PECVD, ALD, PVD, combinations thereof, furnace (thermal oxide), or other suitable techniques. In the present embodiment, the buffer layer 264 has a thickness, which is in a range from about 0.1 microns to about 1 microns. In other embodiments, the buffer layer 264 may have a different suitable value for the thickness. The buffer layer 264 is then patterned in the bonding region 216.

Figure 5:
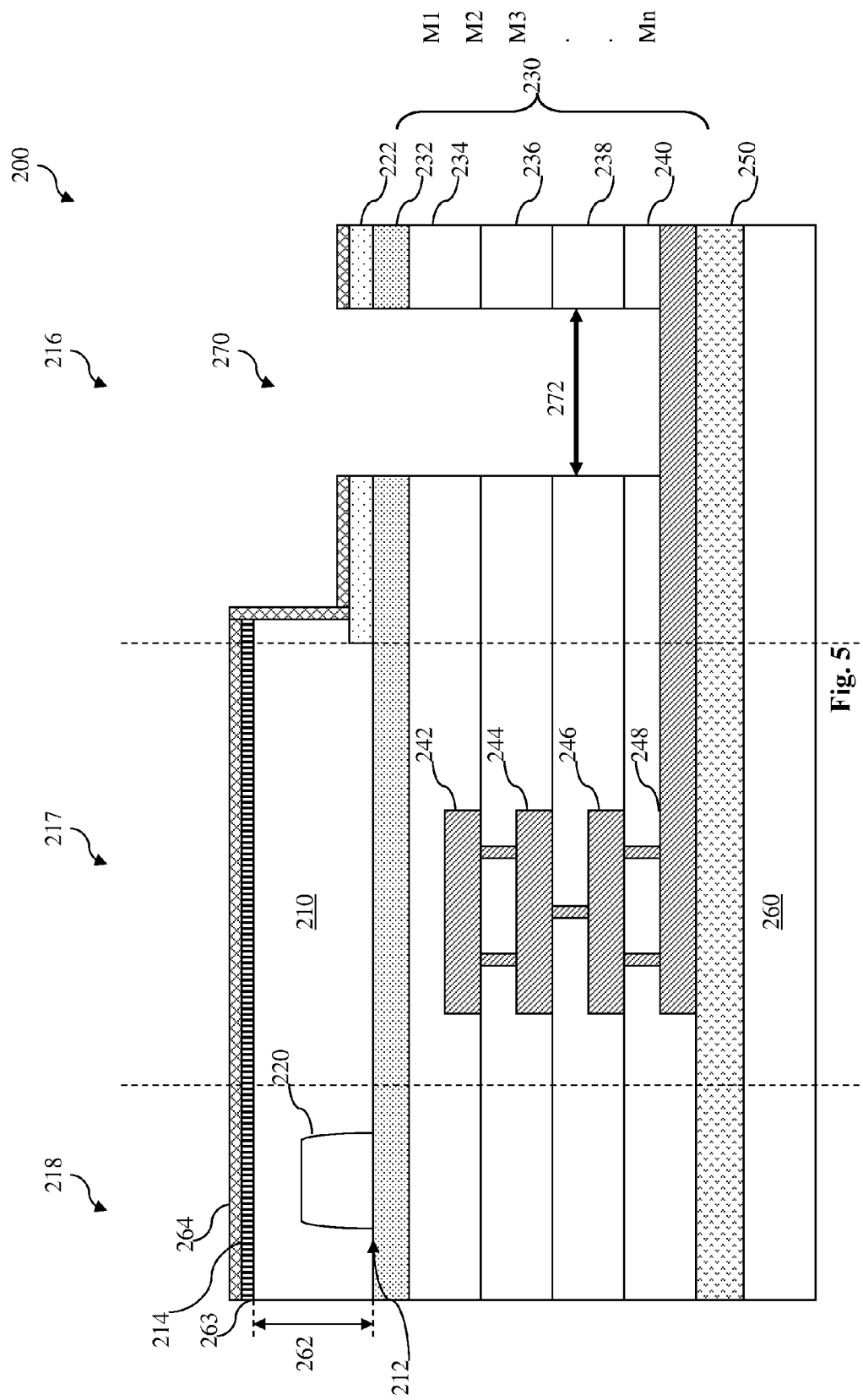

Referring now to FIG. 5, an opening 270 is formed in the bonding region 216 of the device substrate 210. The opening 270 extends through the buffer layer 264 and the interconnect structure 230 so that a portion of the top-most metal layer 248 (i.e., nth metal layer) of the interconnect structure 230 in the bonding region 216 is exposed from the back side 214. The opening 270 is formed by an etching process known in the art, such as a dry etching or wet etching process. The opening 270 has a width 272. In the present embodiment, the opening 270 is formed by a dry etching process and has a width 272 in a range from about 5 microns to about 100 microns. It is understood that the depth of the opening 270 is dependent on the total number of metal layers of the interconnect structure 230 and will thus vary respectively.

Figure 6:
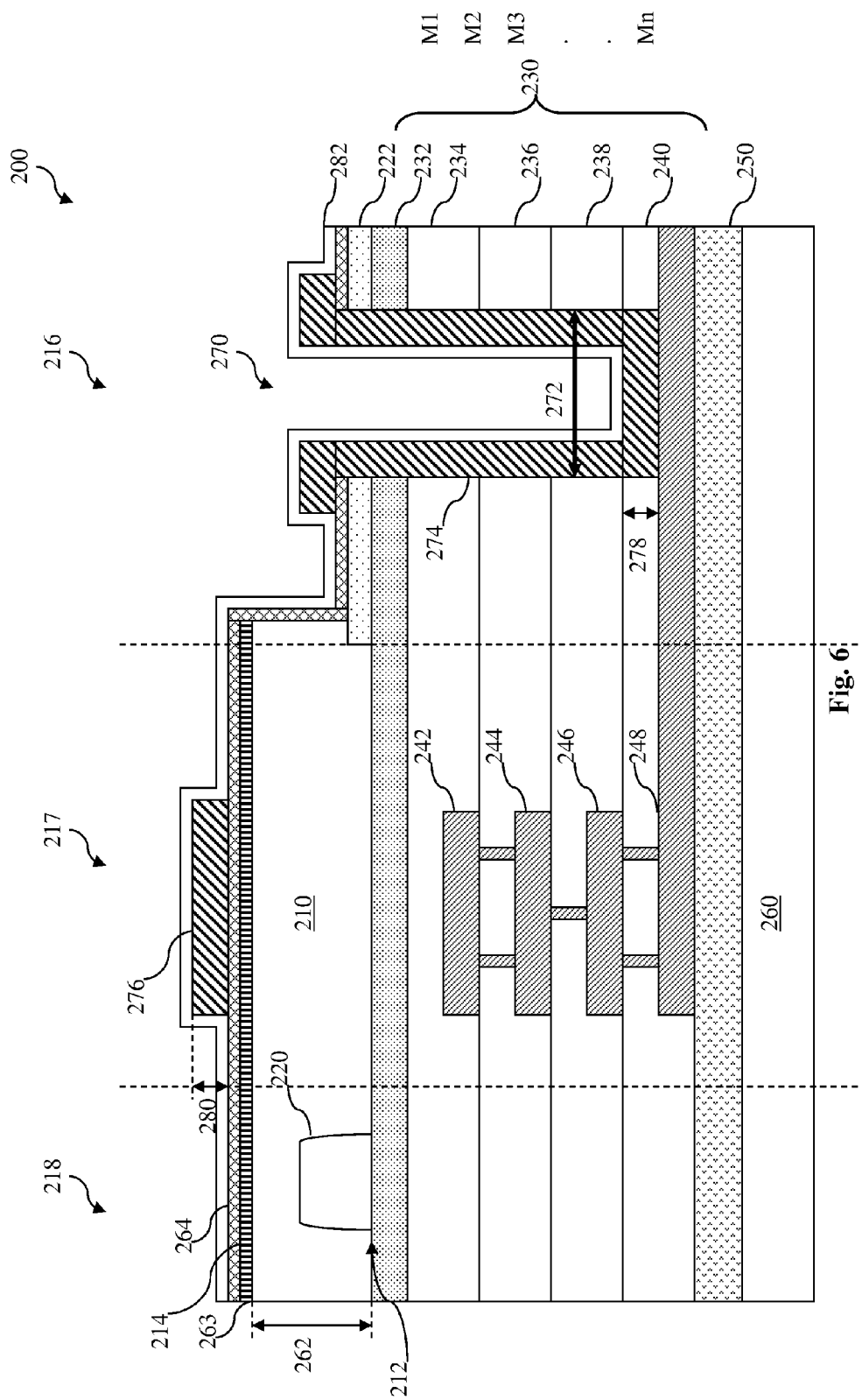

With reference to FIG. 6, a bonding pad 274 is formed over the top metal layer 248 and partially fills the opening 270 in the bonding region 216. A shield structure 276 is formed on the buffer layer 264 in the shield region 217. The bonding pad 274 and shield structure 276 may be formed by the same process. Also, as illustrated in FIG. 6, the bonding pad 274 may have a thickness 278 that is substantially similar to the shield structure 276 thickness 280. The bonding pad thickness 278 and the shield structure thickness 280 may be in the range of about 500 Angstroms to about 10000 Angstroms. In the present embodiment, the bonding pad thickness 278 and the shield structure thickness 280 is about 1000 Angstroms. The bonding pad 274 and shield structure 276 includes a metal material, such as aluminum, copper, aluminum-copper, titanium, tantalum, titanium nitride, tantalum nitride, tungsten, or an alloy thereof, and is formed using a suitable technique in the art, such as CVD, PVD, ALD, combinations thereof, or other suitable techniques. As is illustrated in FIG. 6, the bonding pad 274 comes into contact with the top-most metal layer 248 within the opening 270. Therefore, electrical connections between the image sensor device 200 and devices external to the image sensor device 200 may be established through the bonding pad 274. For the sake of simplicity, only four metal layers (242, 244, 246, and 248) are illustrated, but it is understood that any number (n-number) of metal layers may be implemented in the interconnect structure 230. It is also understood that the STI layer 222 and the buffer layer 264 isolate the bonding pad 274 from the device substrate 210.

A benefit of forming the bonding pad 274 over the top metal layer 248, in accordance with the present embodiment, is that the top metal layer 248 is supported by the passivation layer 250, which is hard (as compared to a low-k dielectric material) and provides good adhesion force (as compared to a low-k dielectric material), thereby inhibiting cracking and peeling issues with the bonding pad. As such, when pressure is applied to the bonding pad 274, during subsequent testing (e.g., ball shearing test), or during a subsequent bonding process, the passivation layer 250 will not yield to allow cracking and subsequent peeling of the bonding pad 274. Thus, the bonding pad 274 cracking and peeling issue is reduced or completely eliminated in the present embodiment.

Still referring to FIG. 6, a passivation layer 282 is formed on the back side of the substrate 210 and also partially fills the opening 270. The passivation layer 282 may include one or more buffer layers. The passivation layer 282 may include any suitable dielectric material. In the present embodiment, the passivation layer 282 includes silicon oxide or silicon nitride. The passivation layer 282 may be formed by a process, such as CVD, PVD, HDPCVD, PECVD, ALD, combinations thereof, furnace (thermal oxide), or other suitable techniques.

Figure 7:
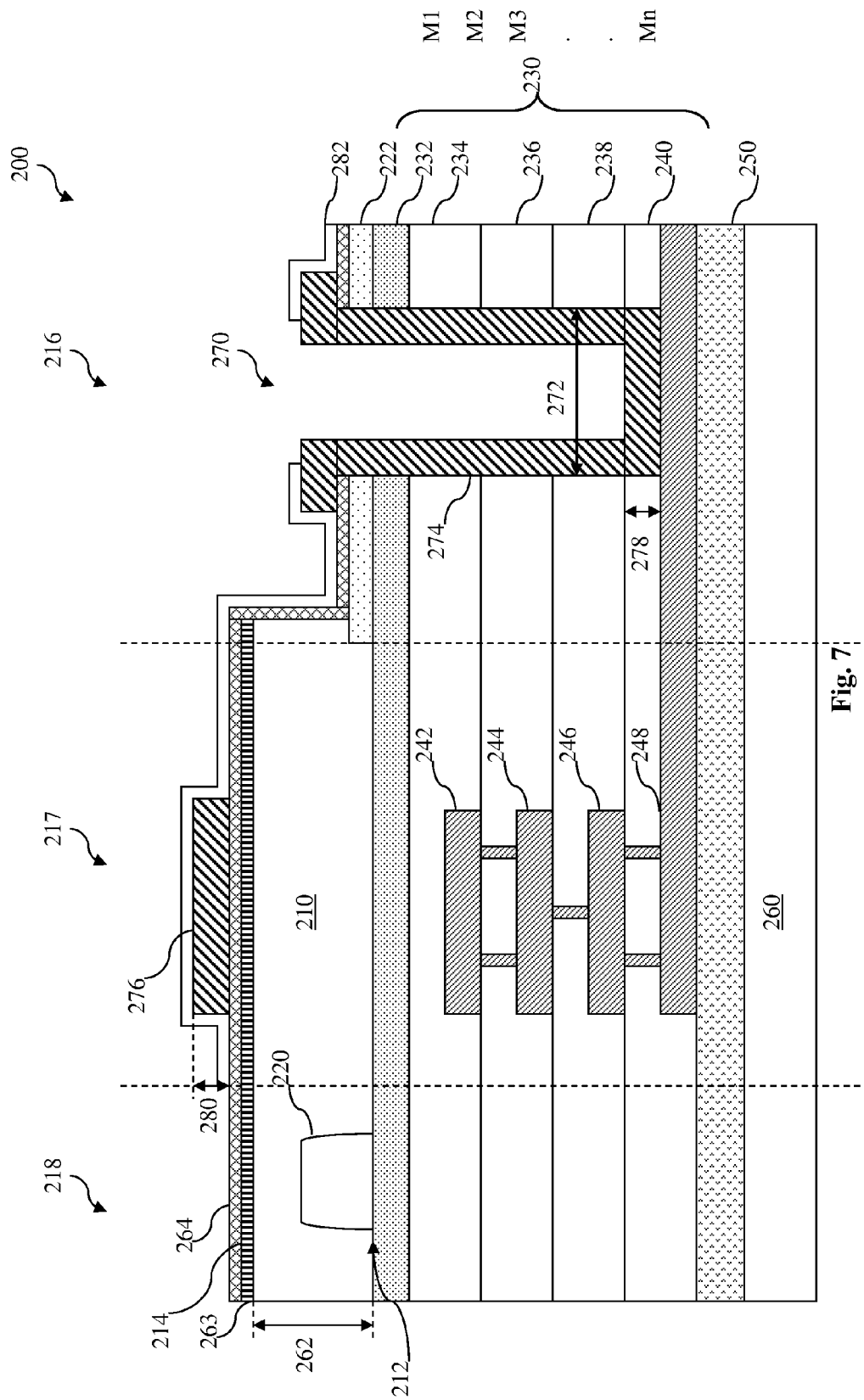

Referring now to FIG. 7, a portion of the passivation layer 282 within the bonding region 216 and within the radiation-sensing region 218 is then etched away using suitable etching process known in the art, such as a wet etching process or a dry etching process.

Though not illustrated, additional processing is performed to complete the fabrication of the image sensor device 200. For example, color filters are formed within the radiation-sensing region 218. The color filters may be positioned such that light is directed thereon and therethrough. The color filters may include a dye-based (or pigment based) polymer or resin for filtering a specific wavelength band of light, which corresponds to a color spectrum (e.g., red, green, and blue). Thereafter, micro-lenses are formed over the color filters for directing and focusing light toward specific radiation-sensing regions in the device substrate 210, such as sensor 220. The micro-lenses may be positioned in various arrangements and have various shapes depending on a refractive index of material used for the micro-lens and distance from a sensor surface. It is also understood that the device substrate 210 may also undergo an optional laser annealing process before the forming of the color filters or the micro-lenses.

Thus, provided is a semiconductor device. The semiconductor device includes a device substrate having a front side and a back side. The semiconductor device further includes an interconnect structure disposed on the front side of the device substrate, the interconnect structure having a n-number of metal layers. The semiconductor device also includes a bonding pad disposed on the back side of the device substrate, the bonding pad extending through the interconnect structure and directly contacting the nth metal layer of the n-number of metal layers.

In some embodiments, the semiconductor device further includes a shield structure disposed on the back side of the device substrate and a radiation-sensing region disposed in the device substrate, the radiation-sensing region being operable to sense radiation projected toward the radiation-sensing region from the back side of the device substrate. In some embodiments, the semiconductor device includes a first passivation layer disposed on the front side of the device substrate, wherein the first passivation layer directly contacts the nth metal layer of the n-number of metal layers; a carrier substrate bonded to the first passivation layer; and a buffer layer disposed on the back side of the device substrate. In further embodiments the semiconductor device includes a second passivation layer disposed on the back side of the device substrate. In various embodiments, first passivation layer includes a material selected from the group consisting of silicon oxide and silicon nitride formed by a PECVD process. In some embodiments the bonding pad and the shield structure includes a material selected from the group consisting of aluminum, copper, aluminum-copper, titanium, tantalum, titanium nitride, tantalum nitride, and tungsten. Also, in certain embodiments, the shield structure has a thickness substantially similar to a thickness of the bonding pad.

Also provided is an alternative embodiment of a semiconductor device. The semiconductor device includes a first substrate having a bonding region and a non-bonding region and having a front side and a back side. The semiconductor device also includes an interconnect structure having a plurality of metal layers disposed on the front side of the first substrate. The semiconductor device further includes an opening on the back side of the first substrate, wherein the opening is formed in the bonding region, and wherein the opening extends through the device substrate to a top-most metal layer of the plurality of metal layers of the interconnect structure. Furthermore, the semiconductor device includes a first conductive material partially filling the opening on the back side of the first substrate in the bonding region, wherein the first conductive material has direct contact with the top-most metal layer of the interconnect structure.

In some embodiments, semiconductor device further includes a second conductive material disposed on the back side of the first substrate in the non-bonding region, a transparent layer disposed over the back side of the first substrate, and a second substrate bonded to the front side of the first substrate. In certain embodiments, the semiconductor device further includes a passivation layer disposed on the front side of the first substrate, wherein the passivation layer includes a material selected from the group consisting silicon oxide and silicon nitride formed by a PECVD process. In various embodiments, the non-bonding region includes a radiation-sensing region having at least one image sensor. In further embodiments, the first and selected from the group consisting of aluminum, copper, aluminum-copper, titanium, tantalum, titanium nitride, tantalum nitride, and tungsten.

Also provided is a method. The method includes providing a device substrate having a front side and a back side. The method further includes forming, on the front side of the device substrate, a interconnect structure having a n-number of metal layers. The method further includes forming, on the back side of the device substrate, an opening in the device substrate extending through the interconnect structure and exposing the nth metal layer of the n-number of metal layers. Also, the method includes forming, on the back side of the device substrate, a bonding pad in the opening, the bonding pad directly contacting the exposed nth metal layer of the n-number of metal layers.

In some embodiments, the method includes forming, on the front side of the device substrate, a first passivation layer, the first passivation layer directly contacting the nth metal layer of the n-number of metal layers and forming, on the back side of the device substrate, a buffer layer. In further embodiments, the method includes forming, on the back side of the device substrate, a shield structure, wherein the shield structure is formed over the buffer layer in a shield region. In certain embodiments, the method includes forming, on the front side of the device substrate, a sensor, wherein the sensor is formed in a radiation-sensing region, and wherein the sensor is operable to sense radiation projected toward the radiation-sensing region from the back side. In various embodiments, the method further includes before the forming of the buffer layer, bonding a carrier substrate to the front side of the device substrate. In some embodiments, the forming of the forming of the first passivation layer includes a PECVD process. In further embodiments, the forming of the bonding pad and the forming of the shield structure is carried out so that a thickness of the bonding pad is substantially the same as a thickness of the shield structure. In further embodiments, the forming of the opening is formed in a bonding region, and wherein the forming of the opening is carried out so that the opening extends vertically through the interconnect structure.

The above disclosure provides many different embodiments, or examples, for implementing different features of the invention. Specific examples of components and arrangements are described above to simplify the present disclosure. These are, of course, merely examples and are not intended to be limiting. Accordingly, the components disclosed herein may be arranged, combined, or configured in ways different from the exemplary embodiments shown herein without departing from the scope of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a device substrate having a front side and a back side;
a shallow trench isolation layer disposed on the front side of the device substrate;
an antireflective coating layer disposed over the back side of the device substrate;
a first buffer layer disposed over the antireflective coating layer on the back side of the device substrate and physically contacting a portion of the shallow trench isolation layer;
a shield structure disposed over the first buffer layer on the back side of the device substrate such that the shield structure physically contacts the first buffer layer,
an interconnect structure disposed on the front side of the device substrate, the interconnect structure having a n-number of metal layers; and
a bonding pad extending through the shallow trench isolation layer and the interconnect structure and directly contacting the nth metal layer of the n-number of metal layers.

2. The semiconductor device of claim 1, further comprising:
a radiation-sensing region disposed in the device substrate, the radiation-sensing region being operable to sense radiation projected toward the radiation-sensing region from the back side of the device substrate.

3. The semiconductor device of claim 2, further comprising:
a first passivation layer disposed on the front side of the device substrate, wherein the first passivation layer directly contacts the nth metal layer of the n-number of metal layers; and
a carrier substrate bonded to the first passivation layer.

4. The semiconductor device of claim 3, further comprising:
a second passivation layer disposed on the back side of the device substrate.

5. The semiconductor device of claim 3, wherein the first passivation layer includes a material selected from a group consisting of silicon oxide and silicon nitride.

6. The semiconductor device of claim 1, wherein the shield structure has a thickness substantially similar to a thickness of the bonding pad.

7. The semiconductor device of claim 1, wherein the antireflective coating layer is disposed over the back side of the device substrate without extending to the bonding pad, and
wherein the first buffer layer is disposed over the antireflective coating layer on the back side of the device substrate such that the first buffer layer physically contacts the antireflective coating layer.

8. The semiconductor device of claim 1, wherein the device substrate has a bonding region and a non-bonding region, wherein the shield structure disposed over the first buffer layer on the back side of the device is disposed within the non-bonding page region and does not extend into the bonding pad region, wherein the bonding pad is disposed within the bonding pad region such that the bonding pad is spaced apart and discontinuous from the shield structure.

9. A method of fabricating a semiconductor device, comprising:
providing a device substrate having a front side and a back side;
forming a shallow trench isolation layer on the front side of the device substrate;
forming, on the front side of the device substrate, a interconnect structure having a n-number of metal layers;
forming, on the back side of the device substrate, an opening in the device substrate extending through the shallow trench isolation layer and the interconnect structure and exposing the nth metal layer of the n-number of metal layers;
forming, on the front side of the device substrate, a first passivation layer, the first passivation layer directly contacting the nth metal layer of the n-number of metal layers;
forming, on the back side of the device substrate, a buffer layer, wherein the buffer layer physically contacts a portion of the shallow trench isolation layer;
forming, on the back side of the device substrate, a bonding pad in the opening, the bonding pad directly contacting the exposed nth metal layer of the n-number of metal layers; and
forming, on the backside of the device substrate, an antireflective coating layer prior to forming, on the back side of the device substrate, the opening, and
wherein the opening extends through the shallow trench isolation layer and the interconnect structure and exposing the nth metal layer of the n-number of metal layers without extending through the antireflective coating layer.

10. The method of claim 9, further comprising:
forming, on the back side of the device substrate, a shield structure, wherein the shield structure is formed over the buffer layer in a shield region.

11. The method of claim 9, further comprising:
forming, on the front side of the device substrate, a sensor, wherein the sensor is formed in a radiation-sensing region, and wherein the sensor is operable to sense radiation projected toward the radiation-sensing region from the back side.

12. The method of claim 10, further comprising:
before the forming of the buffer layer, bonding a carrier substrate to the front side of the device substrate.

13. The method of claim 10, further comprising:
forming, on the back side of the device substrate, a second passivation layer, wherein the second passivation layer overlays the bonding pad and the shield structure; and
etching the second passivation layer in a bonding region.

14. The method of claim 9, wherein the forming of the first passivation layer includes a PECVD process.

15. The method of claim 10, wherein the forming of the bonding pad and the forming of the shield structure is carried out so that a thickness of the bonding pad is substantially the same as a thickness of the shield structure.

* * * * *